(12) United States Patent
Alhussien et al.

(10) Patent No.: US 10,482,983 B2
(45) Date of Patent: Nov. 19, 2019

(54) READ DISTURB DETECTION BASED ON DYNAMIC BIT ERROR RATE ESTIMATION

(71) Applicant: Seagate Technology LLC, Cupertino, CA (US)

(72) Inventors: Abdel Hakim Alhussien, San Jose, CA (US); Ludovic Danjean, San Jose, CA (US); Sundararajan Sankaranarayanan, Fremont, CA (US); Erich Franz Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/850,273

(22) Filed: Dec. 21, 2017

(65) Prior Publication Data

US 2018/0182465 A1  Jun. 28, 2018

Related U.S. Application Data

(60) Provisional application No. 62/437,852, filed on Dec. 22, 2016.

(51) Int. Cl.
| | | |
|---|---|---|
| *G11C 16/34* | (2006.01) | |
| *G11C 16/04* | (2006.01) | |
| *G11C 16/10* | (2006.01) | |
| *G11C 16/26* | (2006.01) | |
| *G11C 11/56* | (2006.01) | |

(Continued)

(52) U.S. Cl.
CPC ...... *G11C 16/3431* (2013.01); *G06F 11/1068* (2013.01); *G11C 11/5642* (2013.01); *G11C 16/0483* (2013.01); *G11C 16/10* (2013.01); *G11C 16/26* (2013.01); *G11C 16/3418* (2013.01); *G11C 7/04* (2013.01)

(58) Field of Classification Search
CPC . G11C 16/3431; G11C 16/0483; G11C 16/10; G11C 16/26; G11C 16/3418; G11C 11/5642; G11C 7/04
USPC .............................................. 365/185, 185.02
See application file for complete search history.

(56) References Cited

U.S. PATENT DOCUMENTS

| | | | | |
|---|---|---|---|---|
| 7,099,190 | B2 * | 8/2006 | Noguchi ............. | G06F 11/1008 365/185.03 |
| 7,430,693 | B2 * | 9/2008 | Noguchi ............. | G06F 11/1048 714/710 |

(Continued)

*Primary Examiner* — Sung Il Cho
(74) *Attorney, Agent, or Firm* — Hall Estill Attorneys at Law

(57) ABSTRACT

Apparatus and method for reducing read disturbed data in a non-volatile memory (NVM). Read operations applied to a first location in the NVM are counted to accumulate a read disturb count (RDC) value. Once the RDC value reaches a predetermined threshold, a flag bit is set and a first bit error statistic (BES) value is evaluated. If acceptable, the RDC value is reduced and additional read operations are applied until the RDC value reaches the predetermined threshold a second time. A second BES value is evaluated and data stored at the first location are relocated if an unacceptable number of read errors are detected by the second BES value. Different thresholds are applied to the first and second BES values so that fewer read errors are acceptable during evaluation of the second BES value as compared to the first BES value.

20 Claims, 4 Drawing Sheets

(51) Int. Cl.
*G06F 11/10* (2006.01)
*G11C 7/04* (2006.01)

(56) References Cited

U.S. PATENT DOCUMENTS

| | | | | |
|---|---|---|---|---|
| 7,818,525 B1 * | 10/2010 | Frost | ............... | G06F 12/0246 365/185.25 |
| 7,975,192 B2 | 7/2011 | Sommer et al. | | |
| 8,060,797 B2 * | 11/2011 | Hida | ............... | G06F 11/1068 714/704 |
| 8,189,379 B2 * | 5/2012 | Camp | ............... | G11C 16/3418 365/185.02 |
| 8,719,652 B2 * | 5/2014 | Mataya | ............... | G06F 12/0866 714/718 |
| 8,811,074 B2 | 8/2014 | Goss et al. | | |
| 8,918,577 B1 * | 12/2014 | Gorobets | ............... | G11O 5/02 711/102 |
| 8,923,066 B1 | 12/2014 | Subramanian et al. | | |
| 8,930,778 B2 * | 1/2015 | Cohen | ............... | G06F 11/2094 711/165 |
| 9,032,264 B2 * | 5/2015 | Hashimoto | ............... | G11C 29/08 714/719 |
| 9,189,385 B2 | 11/2015 | Cohem et al. | | |
| 9,229,642 B2 * | 1/2016 | Shu | ............... | G06F 3/0616 |
| 9,229,805 B2 * | 1/2016 | Yim | ............... | G06F 12/0246 |
| 9,342,246 B2 | 5/2016 | Zhang et al. | | |
| 9,389,950 B2 | 7/2016 | Chennamsetty et al. | | |
| 9,570,198 B2 * | 2/2017 | Bellorado | ............... | G11C 11/5642 |
| 9,678,827 B2 * | 6/2017 | Kim | ............... | G06F 11/10 |
| 9,977,711 B2 * | 5/2018 | Park | ............... | G06F 3/0608 |
| 2008/0288814 A1 * | 11/2008 | Kitahara | ............... | G06F 11/073 714/5.1 |
| 2009/0216936 A1 * | 8/2009 | Chu | ............... | G06F 12/0246 711/103 |
| 2010/0180183 A1 * | 7/2010 | Hung | ............... | G06F 11/1068 714/807 |
| 2011/0066899 A1 | 3/2011 | Kang et al. | | |
| 2014/0108891 A1 * | 4/2014 | Strasser | ............... | G06F 12/0246 714/773 |
| 2016/0162353 A1 | 6/2016 | Manohar et al. | | |

* cited by examiner

READ DISTURB DETECTION BASED ON DYNAMIC BIT ERROR RATE ESTIMATION

RELATED APPLICATIONS

This application makes a claim of domestic priority under 35 U.S.C. 119(e) to U.S. Provisional Application No. 62/437,852 filed Dec. 22, 2016, the contents of which are hereby incorporated by reference.

SUMMARY

Various embodiments are generally directed to reducing the effects of read disturbed data in a non-volatile memory (NVM), such as but not limited to a flash memory in a solid state drive (SSD).

In some embodiments, a method includes counting a number of read operations applied to a first location in a non-volatile memory (NVM) to provide a read disturb count (RDC) value. The RDC value is reduced to a reduced level responsive to the RDC value reaching a predetermined threshold level and responsive to a bit error statistic (BES) value indicating an acceptable rate of read errors occurred during the application of the number of read operations to the first location. Additional read operations that are applied to the first location are counted to increase the RDC value from the reduced level. Data are relocated from the first location to a second location responsive to the RDC value reaching the first threshold level at least a second time and the BES value indicating an unacceptable rate of read errors occurred during the application of the additional read operations.

In other embodiments, an apparatus has a non-volatile memory (NVM), a read/write circuit, and a read data disturb (RDD) manager circuit. The read/write circuit is configured to write data to and read data from the NVM. The read data disturb (RDD) manager circuit is configured to detect a presence of read disturbed data in the NVM and to relocate such read disturbed data to a new location. The RDD manager circuit is configured to count a number of read operations applied to a first location in the NVM to maintain an updated read disturb count (RDC) value, reduce the RDC value to a reduced level responsive to the RDC value reaching a predetermined threshold level and responsive to a bit error statistic (BES) value indicating an acceptable rate of read errors occurred during the application of the number of read operations to the first location, count a number of additional read operations applied to the first location after the RDC value has been reduced to increase the RDC value from the reduced level, determine the BES value indicates an acceptable rate of read errors occurred during the application of the additional read operations as the RDC value reaches the predetermined threshold level a second time, and relocate the data from the first location to a second location in the NVM responsive to the detection of the presence of the read disturbed data.

These and other features and advantages of various embodiments of the present disclosure will be understood from a review of the following detailed description and the accompanying drawings.

DETAILED DESCRIPTION

Figure 1:
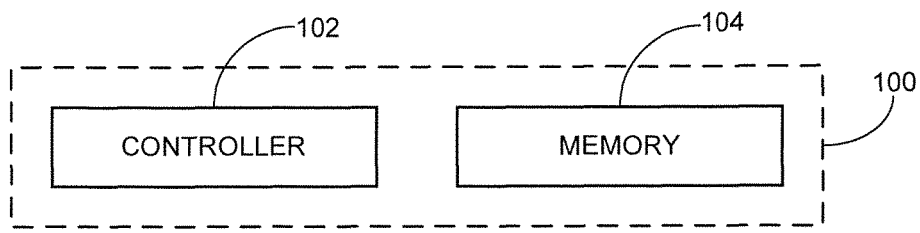
FIG. 1 provides a functional block representation of an exemplary data storage device in accordance with some embodiments.

The present disclosure generally relates to the management of data in a non-volatile memory (NVM), such as but not limited to data stored in a flash memory array.

Read disturbance (also referred to as "read disturb" or "read disturbed data") is a phenomenon that can affect a wide variety of different types of memory devices. Generally, read disturb involves changes to a programmed state of a memory location responsive to repeated read operations upon that memory location. While read disturbed data can be induced in a variety of operational applications, it can be of particular concern in read priority environments where the number of data read operations is significantly greater than the number of data write operations and, if applicable, data erase operations.

In flash memory cells, data are generally stored by accumulating discrete amounts of electrical charge on floating gate structures that affect the forward biased voltage required to place the cells in a drain-source conductive state. Read disturb can result in small shifts in the amount of accumulated charge on the floating gate structures. If the amount of shift in accumulated charge becomes sufficiently pronounced, the memory device may not be able to reliably sense the amount of accumulated charge, and hence the programmed state, of the cells.

Some flash memory array suppliers recommend that data within an array be moved to a new location within the array after a specified threshold number of reads have been performed since the most recent write or erasure of the cell. The specified threshold number of reads may be adjusted based on the number of bits that are stored in each memory cell. SLCs (single level cells) store a single bit per flash memory cell, MLCs (multi-level cells) store two bits per cell, TLCs (three-level cells) store three bits per cell, and so on. More generally, storing n bits in a cell requires $2^n$ separate storage states. As the number of storage states increases, the available drift margin necessary to distinguish among the various states decreases. It follows that the larger the number of bits stored per cell, the lower the specified threshold number of reads will be before the data require relocation.

Data relocation based on read disturb metrics involves a tradeoff between write amplification and data recovery. Write amplification is a metric that generally relates to the total number of times data are moved in the NVM from one location to the next. The greater the write amplification, the faster the NVM will wear out. At the same time, read recovery times can be extended for read disturbed data if multiple read recovery efforts are required by the device to successfully recover the data.

Generally, performing data relocations too frequently increases write amplification and shortens the overall life of the memory due to enhanced program/erase (PE) counts. Performing relocations too seldom increases read retry and recovery rates, slowing down overall data transfer performance and, in some cases, results in an inability to return the stored data to the host device.

Some existing read disturb detection techniques involve monitoring one or more parameters associated with the blocks, such as the total number of reads, a measured bit error rate (BER), etc., and migrating the data once these or other values reach certain thresholds. While operable, these and other techniques have been found to base the relocation decision on worst case levels, and thus often result in blocks being migrated more often than necessary.

Various embodiments of the present disclosure generally operate to enhance data management in a data storage device by providing an adaptive read disturb detection (RDD) technique. As explained below, once data are written to a selected location in a non-volatile memory (NVM), a read disturb count (RDC) is accumulated responsive to a total number of read operations that have been applied to the selected location since the data were written.

A bit error statistic (BES or BES value) is determined based on one or more characteristics associated with the selected location. The BES can be measured in a number of ways. In some embodiments, the BES involves a weighted count based on BER values from data read from the selected location. In other embodiments, error correction statistics (including LDPC iterations, numbers of detected errors, etc.) may be used. Other values can be combined into the BES as well. In some cases, BER measurements based on the first LDPC decoding pass may be discarded and not included in the BES calculation since these values may be higher and tend to dominate the BER performance.

At such time that the RDC value reaches a first selected threshold, the BES value is evaluated, such as by comparing the BES to a different, second threshold. If both the RDC and BES exceed their respective thresholds, the system proceeds to migrate the data, such as in the form of a garbage collection operation so that the data are relocated to a new (second) location in the memory. This will occur occasionally, and data migration at this point is appropriate.

On the other hand, should the RDC exceed the first threshold but the BES does not exceed (or otherwise meet) the second threshold, the RDC value is decremented. The RDC value may be returned to an initial value (e.g., zero reads, etc.), or the RDC value may be decreased to some other value (e.g., decremented by 50% or some other relative value).

A reset flag value may be set to a particular value indicative of the fact that the RDC value has been decremented. Thereafter, the RDC and BES values continue to be monitored. Due to the presence of the flag value having been set, a different third threshold may be used for the BES value. The data are migrated to a new location in the NVM once the RDC value meets the first threshold a subsequent time, the BES value reaches the third threshold, and the flag value has been confirmed to having been set. The second threshold for the BES may be configured to permit a greater rate of bit errors as compared to the third threshold. In this way, the data migration operation will be carried out at an appropriate time based on a balancing of the RDC and BES values.

In some embodiments, the RDC value is accumulated in a multi-bit counter, such as a 12-bit counter. The flag bit can be a most significant bit (MSB) value, such as the most significant $13^{th}$ bit in the RDC counter. Other arrangements can be used.

In further embodiments, the BES updates with a so-called forgetting factor, or derating factor, so that both BES and RDC are updated responsive to each read, but the BES data are smoothed out (e.g., weighted or averaged) so that spikes in BER or other inputs do not adversely impact the accumulated statistics. For example, in some cases certain memory structures such as three-dimensional (3D) NAND flash structures can exhibit a higher BER based on the first read after the data have been written and program verified. The forgetting factor enables the effects of these localized higher BER data points to be attenuated.

Read scrub operations are also implemented in further embodiments. Read scrub operations comprise a background (overhead) read operation carried out by the system to evaluate the existing state of the RDC and/or BES values. The read scrubs may be carried out on a periodic basis to accumulate updated statistics for the BES measurement. This reduces the localization problem of relying solely on host initiated reads, so that more up-to-date BES values are available for all memory locations. This can also reduce the incidence of first read BER spikes in certain memory configurations, such as sometimes experienced in three-dimensional (3D) NAND flash memory arrays.

On-demand read scrub operations may further be carried out in some cases, such as when an extended read recovery operation results in the selection of a new voltage reference (Vref) value or set of values to successfully recover a particular data set. Instead of simply adopting the new Vref value for remaining portions of a given block, the on-demand read scrub operation can evaluate whether the new Vref values in fact enhance data recovery, such as by providing enhanced BER, lower iterations or other error correction recovery efforts (e.g., lower LDPC iterations, etc.). If the new Vref values demonstrate improved performance, the new Vref values are adopted; otherwise, the recovered data may proceed to be relocated.

These and other features and advantages of various embodiments can be understood with a review of FIG. 1 which shows an exemplary data storage device 100. The device 100 includes a controller 102 and a memory module 104. The controller 102 takes the form of a hardware circuit and/or a programmable processor circuit that uses executable programming steps in a local memory to provide top level control for the device 100.

The memory module 104 can be arranged as one or more non-volatile memory (NVM) elements such as rotatable recording discs or solid-state memory arrays. While a separate controller 102 is shown in FIG. 1, such is unnecessary as alternative embodiments may incorporate any requisite controller functions directly into the memory module.

While not limiting, for purposes of the present discussion it will be contemplated that the data storage device 100 is a solid-state drive (SSD) that utilizes erasable NAND flash memory cells in the memory module 104 to provide a main data store for a host device (not shown). Other configurations include a hybrid data storage device (HDSD) that uses both solid-state semiconductor memory and rotatable magnetic recording memory. Other forms of solid state memory can be used, such as rewritable semiconductor memory (e.g., STRAM, RRAM, PLCs, MRAM, etc.).

The host device can be any device that communicates with the storage device 100. The storage device may be physically incorporated into the host device, or the host device may be physically separate from the storage device and communications may be carried out locally or remotely via one or more computer networks using a suitable interface communication protocol.

Figure 2:
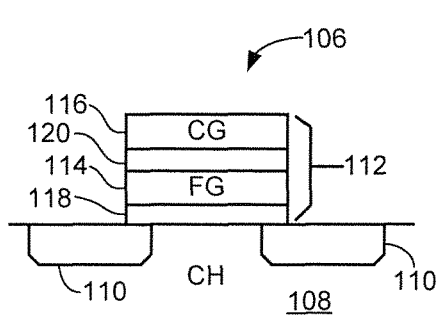
FIG. 2 shows a flash memory cell construction that can be used in the device of FIG. 1.

FIG. 2 illustrates an exemplary NAND flash memory cell 106 that can be incorporated into the memory module 104 of FIG. 1. The memory cell 106 as shown in FIG. 2 is formed on a semiconductor substrate 108 having spaced apart n+ doped regions 110. A gate structure 112 spans the pair of adjacent doped regions so that the flash cell 106 takes a general nMOS transistor configuration. A series of adjacent flash cells can be formed in a NAND configuration with a gate structure 112 spanning each adjacent pair of doped regions 110. Other configurations can be used, including NOR flash, three dimensional (3D) NAND flash, etc.

Each gate structure 112 provides an alternating stack of electrically conductive gates 114, 116 and electrically insulative regions 118, 120. The gate 114 is referred to as a floating gate (FG) and the gate 116 is referred to as a control gate (CG) 116.

Data are stored by each cell 106 in relation to the relative amount of electrical charge stored on the floating gate 114. The floating gate 114 accumulates charge during a programming operation by the selected application of appropriate voltages to the adjacent doped (drain and source) regions 110 and the control gate 116. This induces a controlled migration of electrical charge from a channel (CH) portion of the semiconductor substrate 108 across the insulative region 118 to the floating gate 114.

Accumulated charge is subsequently removed from the floating gate 114 using an erasure operation. During erasure, appropriate voltages are applied to the regions 110 and the control gate 116 to induce migration of the accumulated charge from the floating gate 114 and across the insulative region 118 to the channel CH.

In an initial erased state, there will be substantially no accumulated charge on the FG 114. In this state, the cell will exhibit drain-source conductivity across the channel CH without the application of any significant voltage to the control gate 116. Once charge has been accumulated on the FG 114, the drain-source path will remain non-conductive unless a sufficiently high gate control voltage is applied to the control gate 116, at which point the cell becomes conductive.

The programmed state of the cell 110 can be determined by observing the level of control gate voltage (e.g., reference voltage or Vref) required to allow drain-source current to pass through the cell, which will be correlated to the amount of accumulated charge on the floating gate 114. Different, discrete amounts of total accumulated charge are used to denote different programmed states.

The cells 106 can be configured in a number of ways, including but not limited to single-level cells (SLCs) or multi-level cell (MLCs). An SLC flash cell stores a single bit; a normal convention is to assign the logical bit value of 1 to an erased cell (substantially no accumulated charge) and a logical bit value of 0 to a programmed cell (presence of accumulated charge above a predefined level).

An MLC flash memory cell stores two bits. A normal convention using MLCs is to assign the multi-bit logical value 11 to an erased cell with charge C0 (substantially no accumulated charge), and assign other multi-bit logical values (e.g., 10, 00 and 01) to increasingly higher charge levels C1, C2 and C3 where C0<C1<C2<C3. A cell may be written initially as an SLC to store a first bit from a first data set (e.g., page), and then subsequently written as an MC to store a second bit from a second data set. Other formats can be used including TLCs (three-level cells), XLCs (four-level cells), etc.

Figure 3:
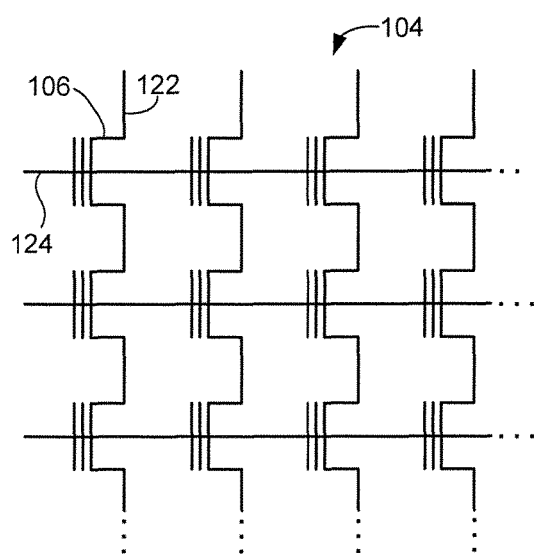
FIG. 3 is a schematic depiction of a portion of a flash memory array using the cells of FIG. 2.

The memory cells 106 can be arranged in the memory module 104 as an array of rows and columns as generally depicted in FIG. 3. Each column of cells can be coupled via one or more bit lines (BL) 122. The control gates (CG) 116 of the cells 106 along each row can be interconnected via individual word lines (WL) 124. Various control circuits can be used to individually access the cells. The arrangement in FIG. 3 is a flat or two-dimensional (2D) array arrangement. Other arrangements, such as 3D NAND stacked arrangements, may also be used and may take a similar configuration from a schematic and operational standpoint.

Figure 4:
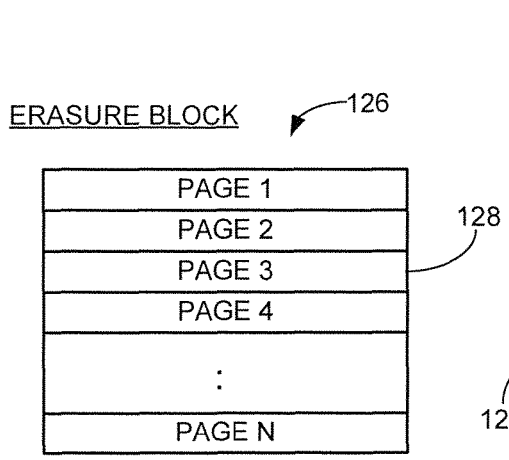
FIG. 4 illustrates a format for an erasure block.

The array of memory cells 106 shown in FIG. 3 may further be grouped into erasure blocks 126, as depicted in FIG. 4. Each erasure block 126 is a separately addressable block and represents the smallest unit of memory that can be concurrent erased at a time. Each row of cells is referred to as a page 128, and each page is configured to store a selected amount of user data. In some cases, multiple pages of data may be stored to the same row of MLCs, with the most significant bit (MSB) indicating the data state of a first page of data and the least significant bit (LSB) indicating the data state of a second page of data.

Block-level wear leveling may be employed by the controller 102 to track the erase and write status of the various blocks 126. New blocks can be allocated for use as required to accommodate newly received data. Metadata and other control information to track the data may be stored in each erasure block 126, or stored elsewhere such as in specific blocks dedicated to this purpose.

Once data are written to a particular group of cells, it is usually required to erase those cells before new data may be written thereto. Data for a particular logical address (e.g., logical block address, or LBA) may be stored in a first page with a first physical address. Should the device 100 receive a write command to write new, updated data for that LBA, the controller 102 may select a second, new page with a different physical address to store the updated data, and may mark the LBA data in the first page as stale (older version) data. When all of the data in a page are superceded, the page may be marked for erasure. When enough pages in a given block are marked for erasure, a garbage collection (GC) operation may be scheduled in the background to migrate current version data to a new block and to erase the existing block.

Figure 5:
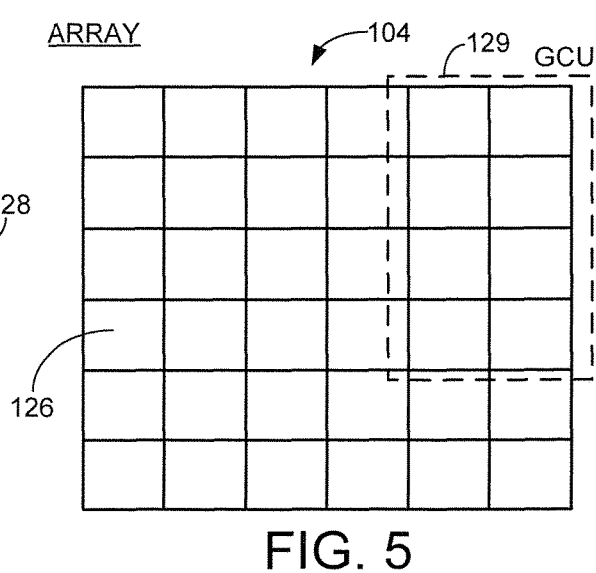
FIG. 5 is an exemplary arrangement of erasure blocks from FIG. 4.

FIG. 5 shows a portion of the memory array 104 as a grouping of erasure blocks 126 from FIG. 4. It is contemplated that the memory array 104 may include any number of such blocks, including blocks on different dies, strips, planes, chips, layers and arrays. Each of the erasure blocks 126 may be separately erasable and the controller 102 may track control information for each erasure block, such as a total number of erasures, date stamp information relating to when the various blocks have been allocated, etc. The controller may group multiple sets of the erasure blocks into larger, multi-block garbage collection units (GCUs) 129 which are then allocated and erased as a unit.

Figure 6:
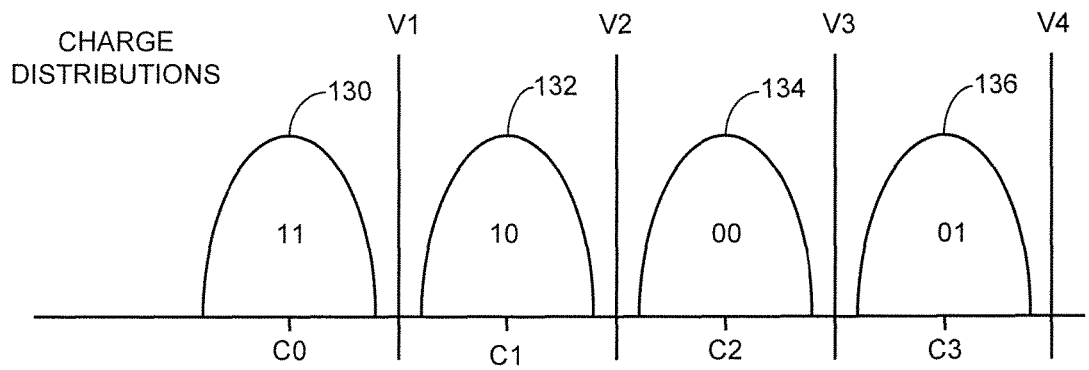
FIG. 6 shows charge distributions indicative of different data storage states for the flash memory cells in a flash memory array.

FIG. 6 shows a sequence of MLC charge distributions 130, 132, 134 and 136. These distributions represent different groupings of memory cells 116 from FIGS. 3-5 that were stored with different charge levels during normal programming operations. Distribution 130 represents a first population of cells programmed to a first nominal charge level C0 (logical 11) state. Distribution 132 represents a second population of cells programmed to a second nominal charge level C1 (logical 10); distribution 134 represents a third population of cells programmed to a third nominal charge level C2 (logical 00); and distribution 136 represents a fourth population of cells programmed to a fourth nominal charge level C3 (logical 01). Other logical designations can be assigned to these distributions.

The populations are shown to be substantially Gaussian about the nominal charge levels C0<C1<C2<C3. The variations in charge level arise as a result of a variety of operational factors. For example, during programming a charge pump may be used to transfer discrete quanta of charge to the cells, and this process may result in slightly different total amounts of accumulated charge on individual cells programmed to the same state. Other contributing factors can include aging and manufacturing variations.

Normally, the distributions are sufficiently distinct such that intervening read sense voltages can be applied to differentiate between the respective distributions and identify the programmed state of a given cell. Four such read sense voltages are depicted in FIG. 6 as V1-V4 with V1<V2<V3<V4. By way of illustration, the application of read sense voltage V3 to the control gates of the various flash cells in FIG. 3 (via word lines 124) would tend to be sufficient to place those cells in the right-most distribution 136 into a conductive state, whereas the cells in the remaining distributions 130-134 would remain in a non-conductive state. The programmed state of any given cell can thus be quickly sensed by the application of one or more of the sense voltages V1-V4 in a sequential order.

Figure 7:
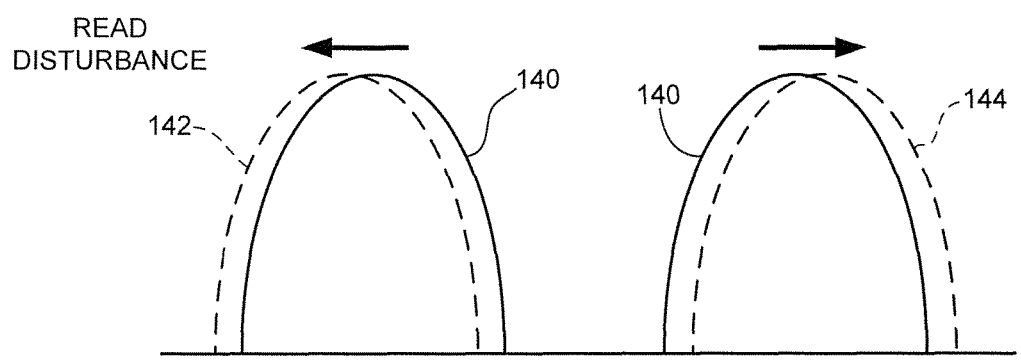
FIG. 7 illustrates exemplary changes in charge distribution that may arise through read disturbance of the data stored in a flash memory array.

FIG. 7 shows another charge distribution 140 to illustrate the shifting of charge as a result of read disturbance effects. In some cases, the repeated reading of the cells in the distribution 140 may result in a change of accumulated charge over time. A loss of charge is generally indicated by shifted distribution 142, and an increase in charge is indicated by shifted distribution 144. Read disturbances as represented in FIG. 7 can arise for read operations upon adjacent cells and not necessarily read operations directly upon those individual cells. Referring again to FIG. 3, it will be noted that reading of any data within a given erasure block will tend to pass current through all of the cells in a particular column. Repetitive reads can thus affect, or disturb, the amounts of charge in individual cells.

Figure 8:
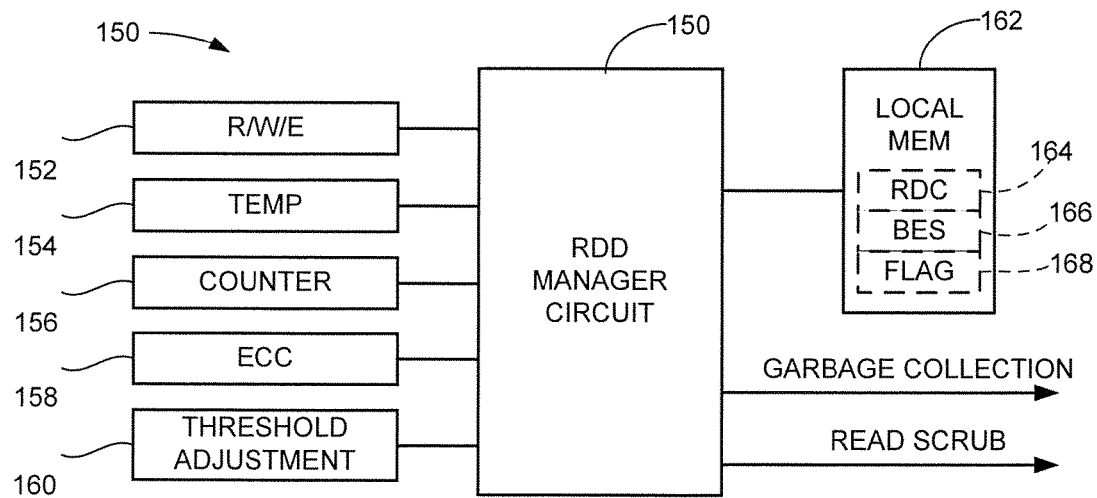
FIG. 8 shows a read disturb detection (RDD) manager circuit configured to manage read disturb detection and data migration operations of the data storage device in accordance with some embodiments.

FIG. 8 provides a functional block representation for a read disturb detection (RDD) manager circuit 150 in accordance with some embodiments. The RDD manager circuit 150 may form a portion of the top level controller 102, or may be realized as some other portion of the storage device 100. In some embodiments, the circuit functionality is realized as a portion of programming firmware that is stored in a local memory and executed by a top level programmable processor circuit.

The RDD manager circuit 150 utilizes a number of inputs from other circuits and elements of the data storage device 100, including a read/write/erase (R/W/E) circuit 152, one or more temperature sensors 154, one or more counters 156, an error correction code (ECC) block 158, and a threshold adjustment circuit 160. Other inputs can be used.

The RDD manager circuit 150 uses these and other parametric inputs as required to maintain, in a local memory 162, various control values including a read disturb count (RDC) value 164, a bit error statistic (BES) value 166 and a reset flag value 168. It is contemplated that the circuit can employ a suitable level of granularity, such as at the individual erasure block or GCU level (see FIG. 5), so that each of these respective locations can have associated RDC, BES and flag values. Other levels of granularity can be used including but not limited to individual memory cells, groups of memory cells, individual rows of memory cells or sets of rows of memory cells within the erasure blocks, individual flash memory dies, groups of flash memory dies, portions of GCUs, groups formed of multiple GCUs, etc. Regardless, various locations within the memory will be identified and these parameters (RDC, BES, FLAG) will be maintained by the RDD manager circuit 150 to initiate various actions such as garbage collection operations, read scrub operations, etc.

In some embodiments, the RDC value is an incremented count value that increments by one (or some other suitable increment) for each read operation carried out upon the associated memory location. In this way, the RDC value can be continuously monitored and updated as required, and compared to a selected threshold value T1. One way to carry this out is to monitor the most significant bit (MSB) of the RDC count in the counter, register or other multi-bit memory location that stores the RDC value and signify that the threshold has been reached once the MSB of the RDC count changes state. Other mechanisms can be used, but setting the T1 threshold to a power of 2 in this way allows the flag value to be set and maintained in an easy and effective manner.

The BES can be determined in a number of ways, such as a weighted average of recently obtained BER values or correction code values utilized to correct bit errors during read operations. In one embodiment, the BES (new_value) can be determined as follows:

$$\text{new\_value}=\max(\text{old\_value},\min(7,\text{floor}(8*\text{observed\_errors}/\text{correction\_limit}))) \quad (1)$$

where old_value is the previous BES value, observed_errors indicates the number of detected errors, and correction_limit is the equivalent 2 kB BCH correction power of each LDPC code used in the correction effort. Other formulations can be used as desired. One or more suitable thresholds are selected for the BES value.

In further embodiments, the newly calculated BES value can be derated by a so-called forgetting factor F, also referred to as a smoothing factor or a derating factor. Suitable values for F can range from about 0.75 to about 0.99. Other values can be used. With the use of the factor F, an updated BES value (BES_temp) can be calculated using equation (1) above, followed by the calculation of the final new BES value (BES_new) as follows:

$$\text{BES\_new}=\max((F)*\text{BES\_old},\text{BES\_temp}) \quad (2)$$

The use of F in equation (2) generally operates to smooth out incremental changes in the BES due to BER spikes or other localized factors. This allows the BES value to better represent the current state of the memory location. Other factors, such as temperature, can be used to adjust the RDC increments and/or the final BES value.

Figure 9:
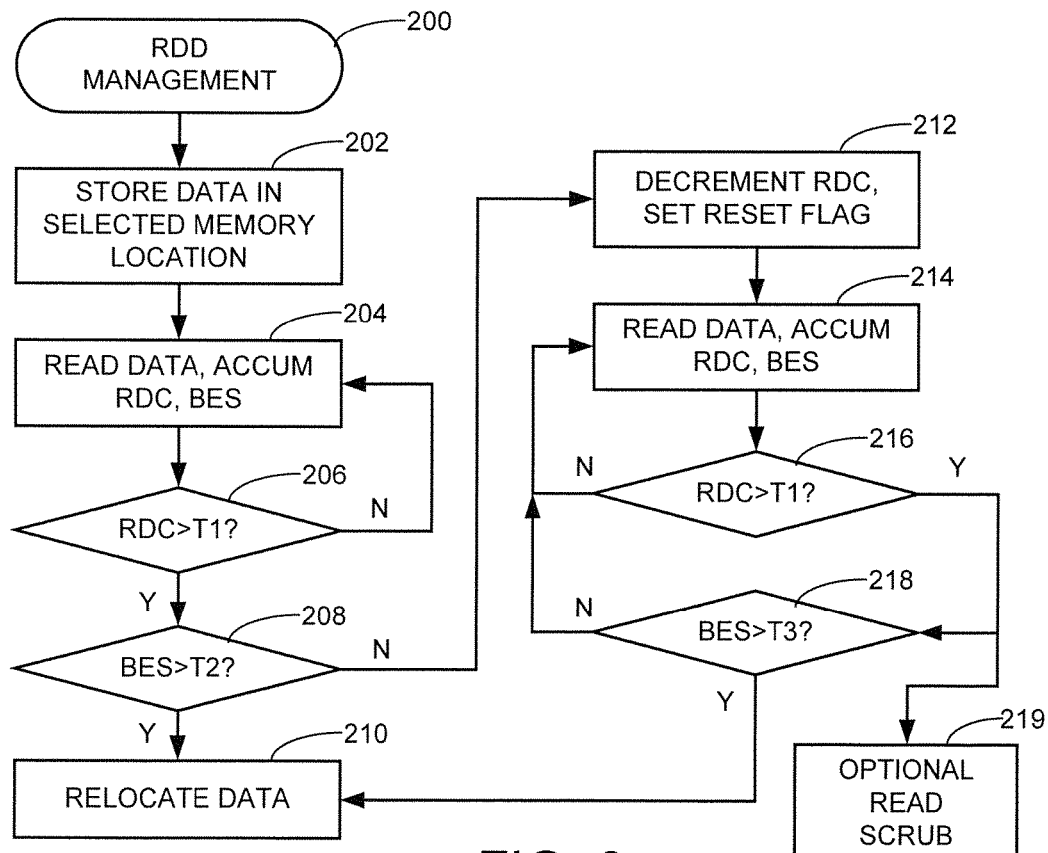
FIG. 9 is a data management routine illustrative of steps carried out in accordance with some embodiments.

FIG. 9 provides a flow chart for an RDD management routine 200 illustrative of steps that may be carried out by the RDD manager circuit 150 of FIG. 8 in some embodiments. FIG. 9 is merely exemplary as other steps may be utilized as desired.

At step 202, the storage device 100 proceeds to store user data in a selected memory location, such as a selected erasure block or GCU (see FIGS. 4-5). Thereafter, a series of host initiated read operations are carried out to the selected memory location to return the requested data to the requesting host, step 204. It will be noted that the written data in step 202 may be to a first set of memory cells in the selected location (e.g., a first row/page) and the read operations may read data from that first set of memory cells or a different, second set of memory cells in the selected location.

During each read, the associated read circuitry (e.g., R/W/E block 152, FIG. 8) of the memory module 104 (FIG. 1) will perform the requisite read operations, through voltage sensing (see FIG. 6) to recover the requested data. In some cases, recovery operations may be carried out if uncorrectable errors are present in the recovered data. The RDC and BES values are incremented responsive to each read operation, as discussed above.

Decision step 206 shows a comparison of the incremented (new) RDC value to the first threshold T1. If RDC remains below this threshold, the routine returns to step 204 for further read and value updates. It will be appreciated that the first threshold T1 may be selected responsive to the total number of bits stored by each memory cell in the associated location. For example, a higher threshold magnitude may be used for SLCs, a lower threshold magnitude may be used for MLCs, a still lower threshold magnitude may be used for TLCs, and so on. The baseline magnitude for the first threshold T1 may further be adaptively adjusted based on previously observed performance over time, different temperatures, etc.

At such time that the RDC value reaches the selected T1 threshold, the flow continues to step 208 where the BES value is compared to a second threshold T2. This second threshold can be selected using empirical data or other parameters, such as aging, overall PE counts, etc., so that the T2 threshold may remain constant during the overall life of the device or it may change over the life of the device. An up-to-date calculation of the BES can be carried out responsive to the RDC count hitting the first threshold T1.

At such time that both RDC and BES meet their respective thresholds, the flow passes to step 210 where the associated data in the selected memory location are migrated (relocated) to a different, second memory location. In some cases, this may involve the scheduling of a garbage collection operation upon the first memory location so that valid (current version data) are buffered and written to a different erasure block, GCU, etc. The first location is then subjected to an erasure operation to reset the memory cells and the erasure block/GCU is placed in an allocation pool pending further allocation for the storage of new data.

Returning to decision step 208, it is contemplated that, at least initially, the RDC value will exceed or otherwise meet the T1 value, but the BES value will not have met the T2 value. In such case, the flow continues to step 212 where RDC is decremented and the reset flag (168, FIG. 8) is set. This signifies the application of a decrease in the RDC value. The present embodiment uses the MSB of the RDC count as the flag bit so a separate operation may not necessarily be required to set the flag. However, this is merely an efficient way to do this and is not necessarily required. In other embodiments, a single or multi-bit flag value can be separately maintained in a suitable register or other memory location.

The manner in which RDC is reduced can vary. In some cases, the amount of reduction may be correlated to the magnitude of BES; the better the BES, the more reduction is applied to the RDC value and vice versa. In other cases, the RDC may be reset to an initial value (such as zero), or may be set to some other value, such as being reduced by some scaling factor (e.g., 50% of the previous value, 75% of the previous value, etc.). The process continues with further read operations as before, step 214 with new increments to the RDC and new adjustments to the BES.

At some point the decremented RDC value will once again reach the T1 threshold, as indicated by decision step 216. As before, the BES value will be evaluated at step 218. In this case, a different, third threshold value T3 is utilized. In some cases, T3 is a very low value, such as 1, so that once the RDC value reaches the T1 value a second time, the system automatically proceeds with the relocation of the data. In other cases, T3 is less than T2 but still provides a meaningful threshold value for the BES, at least potentially permitting RDC to be reset multiple times before the BES T3 threshold is met. As desired, the flag value can be updated to reflect the total number of RDC value resets that occurred. As noted above, multiple decrements can be tracked depending on the form of the reset flag.

Regardless, a different threshold is used for the BES based on the presence of the reset flag value, and when this threshold is met, the system passes to step 210 and the data are relocated. Once the data are relocated, the foregoing processing is applied to the new data location, including the generation of new RDC and BES values for the new location. Similarly, once the first location is recycled and reallocated, new RDC and BES values are generated (and the flag is reset) based on the newly written data for the first location.

In some cases, each time that the RDC value reaches the T1 threshold, the RDD manager circuit 150 (FIG. 8) can additionally perform an optional read scrub operation 219 on the selected memory location. This can comprise the reading of selected pages of data from the location and calculating a new BES value, or an update to the existing BES value. This can enhance the ability of the system to determine a then-existing parametric state of the block and better assess whether a data relocation operation should be carried out. This also ensures that the effects of data localization (e.g., localized reads) don't provide good BES values for high priority areas and less reliable BES values for low priority areas.

Figure 10:
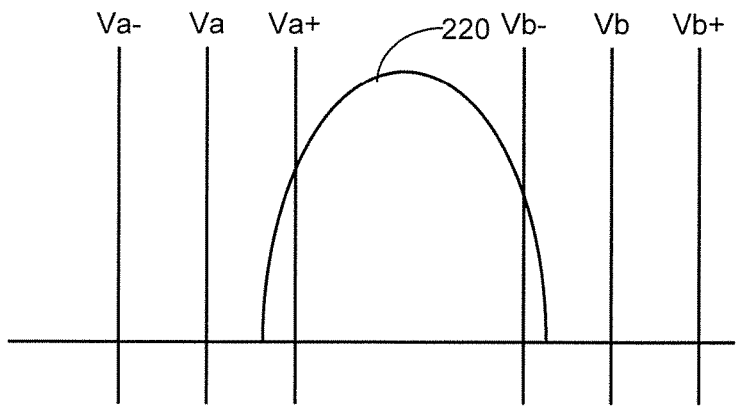
FIG. 10 illustrates application of different read voltage thresholds (Vref) to evaluate the presence or absence of read disturbance effects in accordance with some embodiments.

FIG. 10 shows another population curve 220 for a population of memory cells programmed to a selected one of the states mentioned above (e.g., 11, 10, 00, 01, etc.). During a given read operation, a first read threshold Va can be applied to determine whether one or more of the cells in the distribution 220 is rendered conductive. Additional read thresholds, such as an incremented threshold Va+ and a decremented threshold Va− can also be applied. Additional thresholds above and below the baseline threshold Va covering different intervals can also be applied.

The application of these thresholds can provide an indication of the extent to which read disturbance drift has been experienced by the cells. For example, the threshold Va may be used to sense the programmed state of the associated cells within the distribution 220, and the threshold Va+ can be used to sense the presence and extent to which read disturbance drift has been encountered.

The distribution can be further evaluated using a second set of thresholds Vb, Vb+ and Vb−. The second set of thresholds can be used to evaluate the extent to which additional amounts of accumulated charge have been added to the distribution. In some embodiments, all of the cells in a given location, such as a selected erasure block, can be evaluated using respective multiple sets of thresholds to obtain an accurate statistical measurement of the shape and location of the individual programmed populations.

Adjustments such as indicated in FIG. 10 can be applied to the reference voltages (generally Vref values) in order to recover data when uncorrectable errors are present. For example, a recovery sequence may involve a number of different recovery operations, such as a sequence of free retries where the read operation is simply repeated some measure of times in an effort to recover the data. Other recovery operations can include the use of different reference voltages Vref, different powers of error correction, the use of outer codes to correct data errors, and so on.

Figure 11:
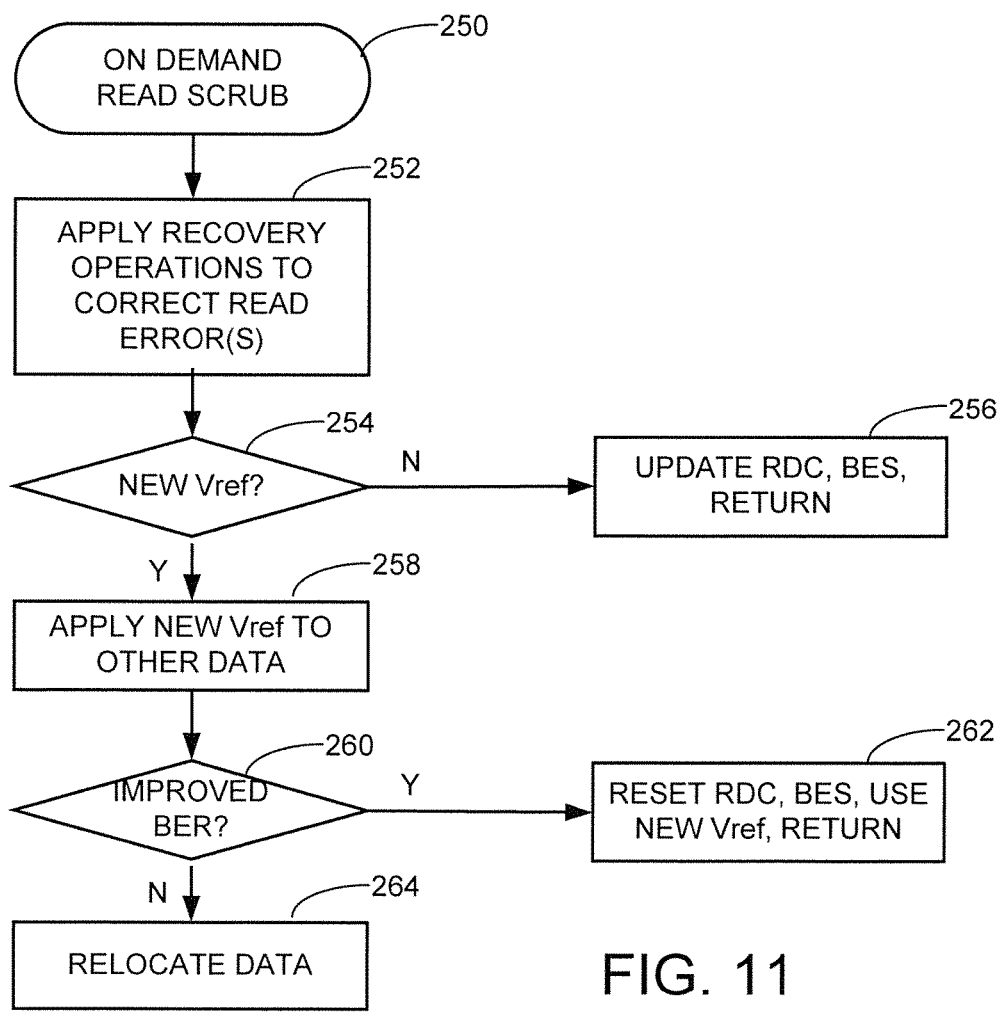
FIG. 11 is an on demand read scrub routine generally illustrative of steps carried out in accordance with some embodiments.

FIG. 11 provides an on demand read scrub routine 250 indicative of further operations that may be carried out by the RDD manager circuit 150 in some embodiments where uncorrectable errors are received during a given read operation. As shown by step 252, one or more recovery operations may be applied as set forth above to correct the read errors and obtain the data for recovery to the host.

Decision step 254 determines whether, during the course of the read recovery operation, a new set of reference voltages Vref were used to successfully recover the data. If not, the flow passes to step 256 where the RDC and BES values are updated, and the routine returns to the normal processing of FIG. 9.

If one or more new Vref values were utilized, the flow passes to step 258 where the new Vref values are applied to other data stored in the memory location, such as other pages of data in the same erasure block, GCU, etc. This enables the manager circuit to better assess the effect that the Vref values have upon BER and error recovery performance, and provides a better indication of whether the block is subject to read disturb or whether other factors may have contributed to the read recovery operation.

Should improved performance be observed using the new Vref, such as enhanced BER rates, etc., as indicated by decision step 260, the flow passes to step 262 where the RDC value is reset to a new, lower value (including back to the initial value). BES is also recalculated using the new data, and the system marks the use of the new Vref value for future reads (see e.g., threshold adjustment block 162, FIG. 8).

On the other hand, if the new Vref values do not show an improvement in the read performance of the other data sampled during the data scrub, the recovered data are relocated to a new location, step 264.

The various embodiments presented herein can provide a number of benefits. Monitoring RDC and BES values can be suitable mechanisms to selecting appropriate times to migrate data due to read disturb and other effects. The operation of the various embodiments to extend the accumulated read counts when the BES indicates continued good performance can prevent unnecessary data migrations and reduce write amplification. Performing read scrub operations, such as the optional read scrub operations in FIG. 9 when the read count threshold is reached or the on demand read scrub operations in FIG. 11 when uncorrected errors are detected, can further ensure that optimal read sense voltages are utilized.

While the illustrated embodiments were primarily directed to managing data in an NVM memory in the form of a NAND flash, other forms of NVM memory can readily be used, including other forms of erasable and rewritable semiconductor memory, rotatable magnetic recording media, etc.

It will now be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
counting a number of read operations applied to a first location in a non-volatile memory (NVM) to provide a read disturb count (RDC) value;
reducing the RDC value to a reduced level responsive to the RDC value reaching a predetermined RDC threshold level and responsive to a bit error statistic (BES) value indicating an acceptable rate of read errors occurred during the application of the number of read operations to the first location using a first BES threshold level;
counting additional read operations applied to the first location after the RDC value has been reduced to increase the RDC value from the reduced level; and
relocating data from the first location to a second location in the NVM responsive to the RDC value reaching the first threshold level at least a second time and the BES value indicating an unacceptable rate of read errors occurred during the application of the additional read operations using a different, second BES threshold level less than the first BES threshold level.

2. The method of claim 1, wherein the predetermined RDC threshold level is a first threshold level to which the RDC value is compared, the first BES threshold level is a second threshold level indicative of a first maximum number of acceptable read errors, the second BES threshold level is a third threshold level indicative of a second maximum number of acceptable read errors less than the first maximum number, wherein a program/erase (PE) count for the first location indicating a total number of erasures of the first location remains constant during successive application of the first, second and third threshold levels, and wherein the PE count for the first location is incremented responsive to the relocating of the data from the first location to the second location and erasure of the first location.

3. The method of claim 1, further comprising prior steps of writing data to the first location and initializing a counter circuit, wherein the counter circuit is used to accumulate the RDC value.

4. The method of claim 1, further comprising setting a flag value in a memory responsive to the RDC value reaching the first threshold level.

5. The method of claim 4, wherein the flag value is a most significant bit (MSB) in a register that stores a multi-bit representation of the RDC value.

6. The method of claim 1, wherein the first location of the NVM comprises a plurality of memory cells, and the predetermined threshold level has a magnitude selected responsive to a total number of data bits stored by each of the memory cells.

7. The method of claim 1, further comprising determining the BES value in relation to a previously calculated BES value and an observed number of detected errors in data read from the first location.

8. The method of claim 7, wherein the updated BES value is further determined by applying a derating factor to smooth out incremental changes in the BES value from localized increases in bit errors, the derating factor providing enhanced weight to the previously calculated BES value.

9. The method of claim 1, wherein multiple counts are added to the RDC value responsive to an increase in temperature.

10. The method of claim 1, further comprising using a first set of read sense voltages to determine the respective RDC and BES values, applying a different, second set of read sense voltages during a read recovery operation to recover data from the selected location, and resetting the RDC and BES values to initialized values responsive to the second set of read sense voltages reducing the number of detected read errors during subsequent read operations applied to the selected location.

11. A method comprising:
performing a write operation to write data to a first location in a non-volatile memory (NVM);
counting each of a plurality of read operations applied to the first location after the write operation to obtain a read disturb count (RDC) value;
accumulating a first bit error statistic (BES) value indicative of a rate of read errors obtained during the plurality of read operations;
setting a flag value responsive to the RDC value reaching a first threshold;
reducing the RDC value responsive to the setting of the flag value and responsive to a comparison of the first BES value with a second threshold;
incrementing the reduced RDC value responsive to each of a plurality of additional read operations applied to the first location after the setting of the flag value;
accumulating a second BES value indicative of a rate of read errors obtained during the plurality of additional read operations; and
relocating the data from the first location to a second location in the NVM responsive to each of the RDC value subsequently reaching the first threshold a second time, the second BES value exceeding a third threshold less than the second threshold, and the setting of the flag value.

12. The method of claim 11, wherein the first BES value is accumulated and compared to the second threshold responsive to the RDC value reaching the first threshold a first time, wherein the second threshold indicates a first maximum number of acceptable read errors, wherein the second BES value is compared to the third threshold responsive to the RDC value reaching the first threshold a subsequent, second time, and wherein the third threshold indicates a second maximum number of acceptable read errors less than the first maximum number.

13. The method of claim 11, further comprising initializing and using a counter circuit to accumulate the RDC value.

14. The method of claim 11, wherein the flag value is a most significant bit (MSB) in a register that stores a multi-bit representation of the RDC value.

15. An apparatus comprising:
a non-volatile memory (NVM);
a read/write circuit configured to write data to and read data from the NVM; and
a read data disturb (RDD) manager circuit configured to:
detect a presence of read disturbed data in the NVM by counting a number of read operations applied to a first location in the NVM to maintain an updated read disturb count (RDC) value, by reducing the RDC value to a reduced level responsive to the RDC value reaching a predetermined threshold level and responsive to a bit error statistic (BES) value indicating an acceptable rate of read errors occurred during the application of the number of read operations to the first location, by counting additional read operations applied to the first location after the RDC value has been reduced to increase the RDC value from the reduced level, and by determining the BES value indicates an unacceptable rate of read errors occurred during the application of the additional read operations as the RDC value reaches the predetermined threshold level a second time; and
relocate data from the first location to a second location in the NVM responsive to the detection of the presence of the read disturbed data, the RDD manager circuit comprising a counter circuit configured to count a total number of read operations and a buffer memory which accumulates the RDC value as a multi-bit value, the RDD manager further configured to reduce the RDC value responsive to the toggling of a most significant bit (MSB) value location in the buffer memory by the RDC value.

16. The apparatus of claim 15, wherein the RDD manager circuit further comprises at least one programmable processor circuit which executes programming instructions stored in a memory location to detect the presence of the read disturbed data.

17. The apparatus of claim 15, wherein the BES is accumulated and compared to a second threshold responsive to the RDC value reaching the first threshold a first time, wherein the BES is subsequently accumulated and compared to a third threshold responsive to the RDC value reaching the first threshold a second time, wherein the second threshold indicates a first maximum number of acceptable read errors, and wherein the third threshold indicates a second maximum number of acceptable read errors less than the first maximum number.

18. The apparatus of claim 15, configured as a solid state drive (SSD), wherein the NVM comprises NAND flash memory.

19. An apparatus comprising:
a non-volatile memory (NVM);
a read/write circuit configured to write data to and read data from the NVM; and
a read data disturb (RDD) manager circuit configured to:
write data to a first location in the NVM;
count a number of read operations applied to the first location in the NVM to maintain an updated read disturb count (RDC) value;
reduce the RDC value to a reduced level responsive to the RDC value reaching a predetermined threshold level and responsive to a first bit error statistic (BES) value indicating an acceptable rate of read errors occurred during the application of the number of read operations to the first location;
count additional read operations applied to the first location after the RDC value has been reduced;
determine an updated second BES value by applying a derating factor to smooth out incremental changes in the first BES value from localized increases in bit errors; and
relocate the data from the first location to the second location responsive to the RDC value reaching the predetermined threshold level a second time and the updated second BES value indicating an unacceptable rate of read errors occurred during the application of the additional read operations.

20. The apparatus of claim 19, wherein the RDD manager circuit excludes read errors encountered during a first pass through a low density parity check (LDPC) decoder from the first and second BES values.

* * * * *